United States Patent
Pyeoun

(10) Patent No.: US 9,313,432 B2
(45) Date of Patent: Apr. 12, 2016

(54) IMAGE SENSOR HAVING DEPTH DETECTION PIXELS AND METHOD FOR GENERATING DEPTH DATA WITH THE IMAGE SENSOR

(71) Applicant: SK hynix Inc., Gyeonggi-do (KR)

(72) Inventor: Chang-Hee Pyeoun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 37 days.

(21) Appl. No.: 14/532,838

(22) Filed: Nov. 4, 2014

(65) Prior Publication Data

US 2016/0065870 A1    Mar. 3, 2016

(30) Foreign Application Priority Data

Aug. 28, 2014  (KR) .................. 10-2014-0112887

(51) Int. Cl.
| | |
|---|---|
| H04N 3/14 | (2006.01) |
| H04N 5/369 | (2011.01) |
| H04N 9/04 | (2006.01) |
| G02B 5/20 | (2006.01) |
| H04N 5/378 | (2011.01) |
| H04N 5/225 | (2006.01) |

(52) U.S. Cl.
CPC .............. *H04N 5/369* (2013.01); *G02B 5/20* (2013.01); *H04N 5/2253* (2013.01); *H04N 5/2254* (2013.01); *H04N 5/378* (2013.01); *H04N 9/045* (2013.01)

(58) Field of Classification Search
CPC .................................................... H04N 5/3696
USPC ........................................ 348/294, 302, 311
See application file for complete search history.

(56) References Cited

U.S. PATENT DOCUMENTS

| | | | |
|---|---|---|---|
| 8,976,277 B2 * | 3/2015 | Fossum ............... | H04N 5/3696 348/294 |
| 2011/0128423 A1 | 6/2011 | Lee et al. | |

FOREIGN PATENT DOCUMENTS

KR      1020100018851      2/2010

* cited by examiner

*Primary Examiner* — Joel Fosselman
(74) *Attorney, Agent, or Firm* — IP & T Group LLP

(57) ABSTRACT

An image sensor includes: a plurality of pixels that include a plurality of color detection pixels and a plurality of depth detection pixels, wherein the plurality of pixels are arranged in two dimensions; and a photoelectric conversion layer formed to correspond to the plurality of pixels, wherein each of the plurality of the color detection pixels comprises: a first light condensing layer disposed over the photoelectric conversion layer; and a band pass filter layer interposed between the photoelectric conversion layer and the first light condensing layer, and wherein each of the plurality of the depth detection pixels comprises: a second light condensing layer disposed over the photoelectric conversion layer and having a greater size than a size of the first light condensing layer.

16 Claims, 8 Drawing Sheets

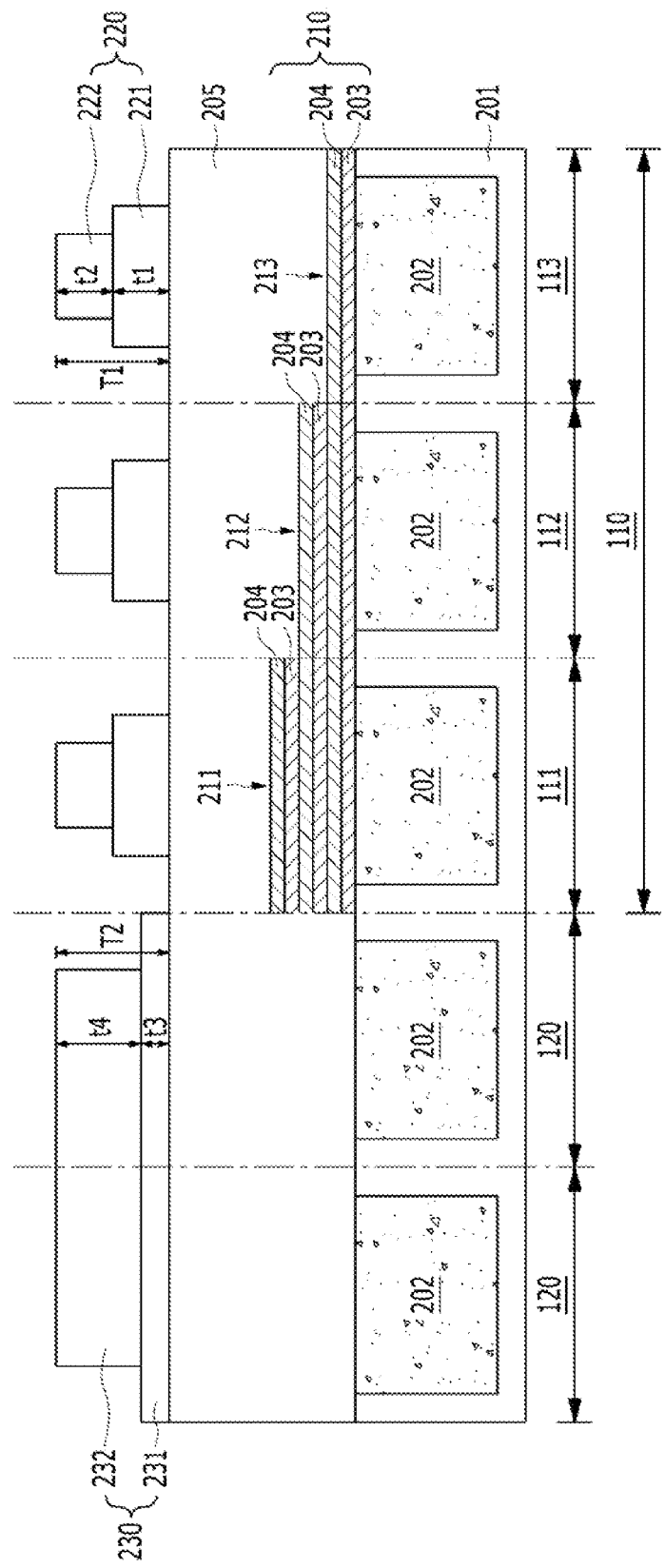

IMAGE SENSOR HAVING DEPTH DETECTION PIXELS AND METHOD FOR GENERATING DEPTH DATA WITH THE IMAGE SENSOR

CROSS-REFERENCE TO RELATED APPLICATIONS

The present application claims priority of Korean Patent Application No. 10-2014-0112887, filed on Aug. 28, 2014, which is incorporated herein by reference in its entirety.

BACKGROUND

1. Field

Exemplary embodiments relate to a semiconductor fabrication technology and, more particularly, to an image sensor having depth detection pixels, and a method for generating depth data by using the image sensor.

2. Description of the Related Art

Image sensors transform optical signals including image or depth data into electrical signals. Researchers and the industry are ardently studying and developing high-precision three-dimensional (3D) image sensors that provide depth data in addition to image data.

SUMMARY

An embodiment is directed to an image sensor including depth detection pixels, and a method for generating depth data by using the image sensor.

In accordance with an embodiment, an image sensor includes: a plurality of pixels that include a plurality of color detection pixels and a plurality of depth detection pixels, wherein the plurality of pixels are arranged in two dimensions; and a photoelectric conversion layer formed to correspond to the plurality of pixels, wherein each of the plurality of the color detection pixels comprises: a first light condensing layer disposed over the photoelectric conversion layer, and a band pass filter layer interposed between the photoelectric conversion layer and the first light condensing layer, and wherein each of the plurality of the depth detection pixels comprises: a second light condensing layer disposed over the photoelectric conversion layer and having a greater size than a size of the first light condensing layer.

The image sensor may further include: a dielectric layer formed over the photoelectric conversion layer, having a planar upper surface, and including the band pass filter layer, wherein the first light condensing layer and the second light condensing layer are formed over the dielectric layer.

The band pass filter layer may extend to the plurality of depth detection pixels to be interposed between the photoelectric conversion layer and the second light condensing layer. The band pass filter layer of the depth detection pixels may be thicker than the band pass filter layer of the color detection pixels.

Two or more of the depth detection pixels may share one second light condensing layer. The thickness of the first light condensing layer may be the same as the thickness of the second light condensing layer, or the first light condensing layer may be thinner than the second light condensing layer.

Each of the first light condensing layer and the second light condensing layer includes a stacked structure of a plurality of material layers, wherein an upper layer of the first light condensing layer has a smaller size than a lower layer of the first light condensing layer, and wherein an upper layer of the second light condensing layer has a smaller size than a lower layer of the second light condensing layer. The size of a lowermost layer of the first light condensing layer may be shorter than a size of a lowermost layer of the second light condensing layer. The total thickness of the first light condensing layer is the same as a total thickness of the second light condensing layer, and wherein a lowermost layer of the second light condensing layer is thinner than a lowermost layer of the first light condensing layer.

The first light condensing layer may includes a hemispheric lens, wherein the second light condensing layer may includes a stacked structure of a plurality of material layers, and wherein an upper layer of the plurality of material layers has a smaller size than a lower layer of the plurality of material layers.

The band pass filter layer may include a stacked structure of a plurality of filter layers, and wherein the plurality of filter layers has different refraction indices from each other.

The plurality of the color detection pixels may includes first color pixels, second color pixels, and third color pixels, wherein the band pass filter layer of the first color pixels is thicker than the band pass filter layer of the second color pixels, and wherein the band pass filter layer of the second color pixels is thicker than the band pass filter layer of the third color pixels.

The first color pixels may include red pixels, and the second color pixels may include green pixels, and the third color pixels may include blue pixels.

The plurality of the pixels may further include a plurality of phase difference detection pixels, and wherein each of the plurality of the phase difference detection pixels may include: a third light condensing layer disposed over the photoelectric conversion layer; and a light blocking layer interposed between the photoelectric conversion layer and the third light condensing layer and having an opening that is eccentrically disposed based on with respect to an optical axis of the photoelectric conversion layer.

The third light condensing layer includes a hemispheric lens or a stacked structure of a plurality of material layers, and wherein an upper layer of the plurality of material layers has a smaller size than a lower layer of the plurality of material layers.

In accordance with another embodiment, a method for generating depth data in an image sensor provided with a plurality of pixels including a plurality of color detection pixels, a plurality of depth detection pixels, and a plurality of phase difference detection pixels that are arranged in two dimensions, comprising: calculating a blur weight value from the plurality of phase difference detection pixels; extracting a first edge value from the plurality of color detection pixels; extracting a second edge value from the plurality of depth detection pixels; calculating a first blur value and a second blur value based on the first edge value and the second edge value using a Point Spread Function; amplifying the first blur value and the second blur value by reflecting the blur weight value into the first blur value and the second blur value; and generating depth information based on a difference between the amplified first blur value and the amplified second blur value.

BRIEF DESCRIPTION OF THE DRAWINGS

FIGS. 4A and 4B illustrate an image sensor in accordance with an embodiment.

DETAILED DESCRIPTION

Figure 1:
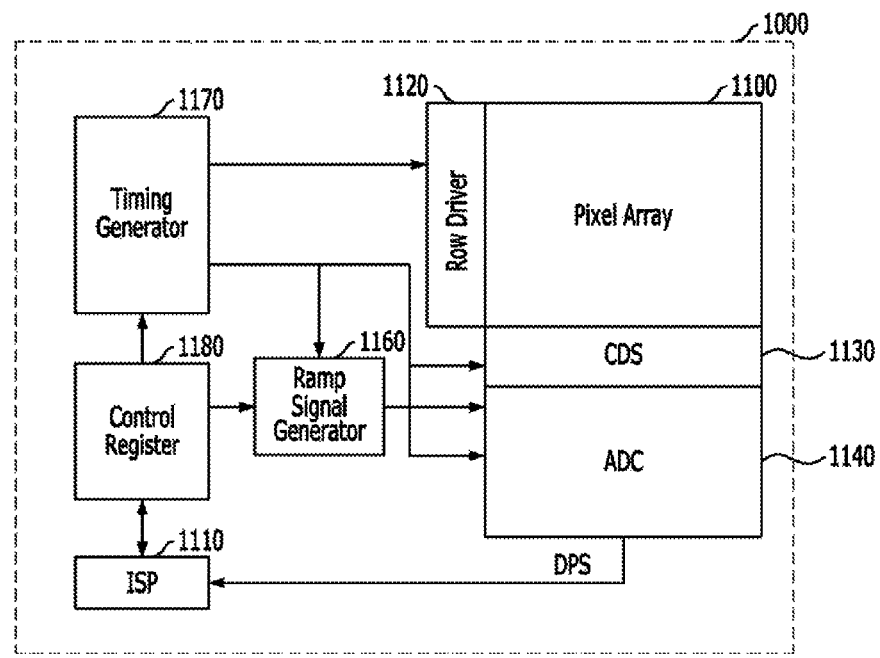
FIG. 1 is a block view illustrating an image sensor accordance with an embodiment.

Exemplary embodiments will be described below in more detail with reference to the accompanying drawings. The embodiments may, however, be modified in different forms and should not be construed as limited to the configurations set forth herein. Throughout the disclosure, like reference numerals refer to like parts.

The drawings are not necessarily to scale and, in some instances proportions may have been exaggerated in order to clearly illustrate features of the embodiments. When a first layer is referred to as being "on" a second layer or "on" a substrate, it not only refers to where the first layer is formed directly on the second layer or the substrate but also where a third layer exists between the first layer and the second layer or the substrate.

The following embodiments provide an image sensor including depth detection pixels and a method for generating depth data by using the image sensor. Depth data is essential to realizing a three-dimensional (3D) image. Diverse technologies, which have been suggested to generate depth data, include Time Of Flight (TOF), triangulation, an infrared ray (IR) radiation pattern detection method, semi-automatic algorithm and so forth. The methods require a light source, such as an infrared ray light source to make a depth difference. However, it has a problem in that depth data is not reliably produced in high illumination environments (such as outdoor environment in daytime), due to interferences. Also, the triangulation technique and a stereo camera technique may generate highly accurate depth data, but their structures are complicated and their prices are expensive because they require a plurality of cameras and expensive equipment.

To address these issues, the following embodiments provide an image sensor including a plurality of color detection pixels and a plurality of depth detection pixels. The depth detection pixels have a different focal length from that of the color detection pixels in a pixel array. In the pixel array, a plurality of pixels is arranged in two dimensions (2D). The focal length may be a focal length between an object and each pixel, and the focal length from the depth detection pixels may be longer than the focal length from the color detection pixels. Under a structure where the color detection pixels and the depth detection pixels are integrated in the pixel array and have different focal lengths from each other, interference from external environment, e.g., a high illumination environment, may be effectively suppressed. As a result, accurate depth data may be generated. Also, since the image sensor has a simple structure and is suitable for mass production, the image sensor may be provided at an economical price.

FIG. 1 is a block view illustrating an image sensor in accordance with an embodiment.

Referring to FIG. 1, the image sensor 1000 may include a pixel array 1100, an Image Signal Processor (ISP) 1110, a row driver 1120, a Correlated Double Sampler (CDS) 1130, an Analog-Digital Converter (ADC) 1140, a ramp signal generator 1160, a timing generator 1170, and a control register 1180.

The pixel array 1100 may include a plurality of pixels for generating pixel signals based on the intensity of incident light. Each of the pixels may include at least one pixel transistor and a photoelectric conversion element. Each pixel transistor may include a transfer transistor, a reset transistor, a drive transistor, and a select transistor. The transfer transistor is coupled with the photoelectric conversion element. The reset transistor shares a floating diffusion region with the transfer transistor. The drive transistor has its gate coupled with the floating diffusion region. The select transistor is coupled in series with the drive transistor. The photoelectric conversion element may include a photodiode or a pinned photodiode. The pixels of the pixel array 1100 may include a plurality of color detection pixels, a plurality of depth detection pixels, and a plurality of phase difference detection pixels, which will be described in detail below.

The timing generator 1170 may apply a control signal or a dock signal to the row driver 1120, the correlated double sampler 1130, the analog-digital converter 1140, and the ramp signal generator 1160 to control given operations or timings. The control register 1180 may store various commands necessary for operation of the image sensor 1000.

The row driver 1120 may decode the control signal or the clock signal that is outputted from the timing generator 1170 and supply a gate signal to each row of the pixel array 1100. The pixel array 1100 may output a pixel signal. The pixel signal is outputted from a row which is selected based on the gate signal transmitted from the row driver 1120. In other words, the digital pixel signal (DPS) transmitted from the pixel array 1100 to the image signal' processor 1110 may be provided through a certain selected row.

The image signal processor 1110 processes the digital pixel signal (DPS) outputted from the pixel array 1100 through the correlated double sampler 1130 and the analog-digital converter 1140. The digital pixel signal (DPS) is outputted in form of image data that human beings may see. The image signal processor 1110 may include a control block, a memory block, a phase difference detection block including a blur weight value generation unit, an edge detection block, and a depth detection block, which will be described below.

Figure 2A:
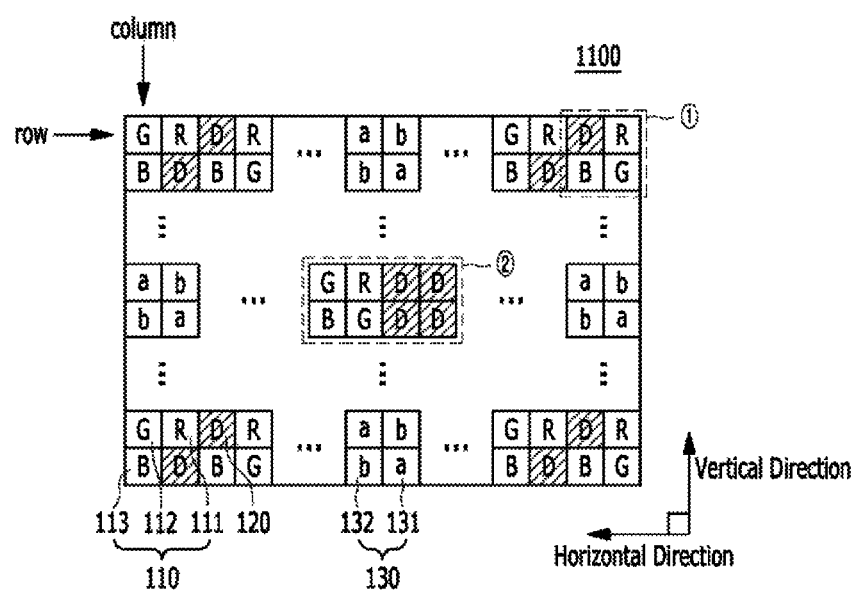
FIGS. 2A to 2C are plan views illustrating a pixel array of the image sensor in accordance with embodiments.
Figure 2B:
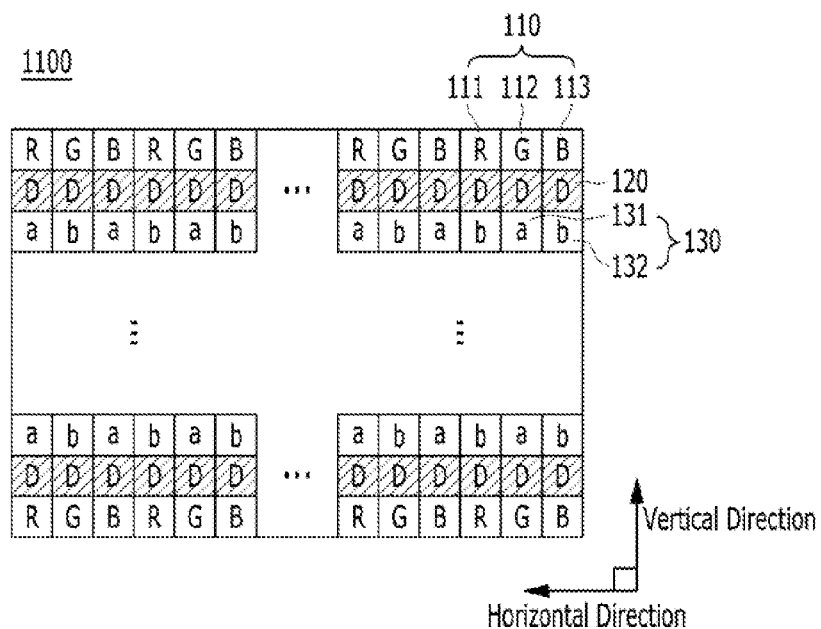
Figure 2C:
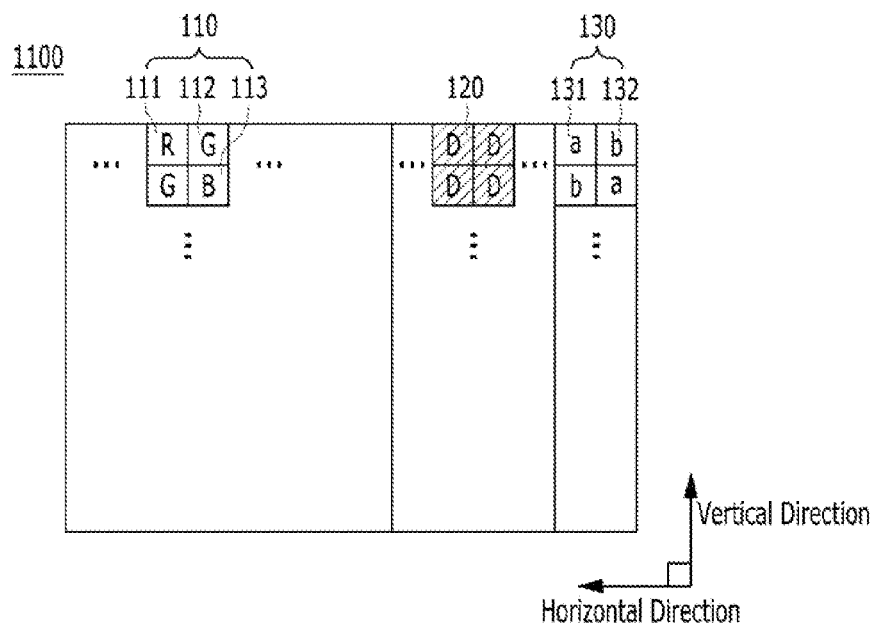

FIGS. 2A to 2C are plan views illustrating pixel arrays of an image sensor in accordance with an embodiment. FIG. 2A is a plan view illustrating a pixel array of an image sensor in accordance with an embodiment, and FIGS. 2B and 2C are plan views illustrating pixel arrays of the image sensor in accordance with other embodiments.

Referring to FIG. 2A, the pixel array 1100 of the image sensor 1000 may include a plurality of pixels that are arranged in two dimensions, and the pixels may include a plurality of color detection pixels 110, a plurality of depth detection pixels 120, and a plurality of phase difference detection pixels 130. The color detection pixels 110 may be arranged based on a Bayer arrangement and the depth detection pixels 120 and the phase difference detection pixels 130 may be randomly disposed in such a manner that the depth detection pixels 120 and the phase difference detection pixels 130 replace the color detection pixels 110 at particular locations. The phase difference detection pixels 130 may be randomly disposed by pixel group unit. In an embodiment, one pixel group may include two pixels 131 and 132 and may include light blocking layers 251, 252. See FIGS. 2A-2C and 5. The light blocking layers 251, 252 have openings 251A, 252A that are eccentrically disposed with respect, to a center axis of the phase difference detection pixels 130.

In the pixel array 1100, a plurality of color detection pixels 110 and one or more depth detection pixels 120 may be disposed in every single row and/or column. One or more phase difference detection pixels 130 may be disposed in every single row and/or column, or in one or more rows and/or columns.

Also, in the pixel array 1100, a plurality of color detection pixels 110 may be disposed in every single row and/or column, and one or more depth detection pixels 120 may be disposed in one or more rows and/or columns. Two or more phase difference detection pixels 130 may be disposed in the same row and/or column where the depth detection pixels 120 are disposed, or two or more phase difference detection pixels 130 may be disposed in a row and/or a column different from one where the depth detection pixels 120 are disposed.

The color detection pixels 110 may include first color pixels 111, second color pixels 112, and third color pixels 113. The first to third color pixels 111 to 113 may be arranged in a Bayer pattern. The first color pixels 111 may be red pixels R, and the second color pixels 112 may be green pixels G, and the third color pixels 113 may be blue pixels B. Alternatively, the first to third color pixels 111 to 113 may be Cyan pixels, Magenta pixels, and Yellow pixels, respectively.

The depth detection pixels 120 may be disposed randomly by replacing one of the color detection pixels 110 that are arranged in the Bayer pattern. For example, the depth detection pixels 120 may replace green pixels G in a 2×2 array. See reference numeral ① in FIG. 2A. Also, in a 2×4 array, the depth detection pixels 120 may replace all the color detection pixels 110 corresponding to a 2×2 array. See the reference numeral ② in FIG. 2A. As a result, the color detection pixels 110 are in a 2×2 array.

Subsequently, referring to FIG. 2B, the color detection pixels 110, the depth detection pixels 120, and the phase difference detection pixels 130 may be disposed row by row. In other words, the pixel array 1100 may include a first row where the color detection pixels 110 are disposed, a second row where the depth detection pixels 120 are disposed, and a third row where the phase difference detection pixels 130 are disposed. The first to third rows may be adjacent to each other in a vertical direction, or they may be spaced apart from each other and randomly located. In another embodiment, the color detection pixels 110, the depth detection pixels 120, and the phase difference detection pixels 130 may be disposed column by column.

Subsequently, referring to FIG. 2C the color detection pixels 110, the depth detection pixels 120, and the phase difference detection pixels 130 may be disposed block by block (or region by region). The number of the blocks where the pixels are disposed may be one or more. The area and the shape of the blocks where the pixels are disposed may vary according to given specifications and desired characteristics.

Figure 3A:
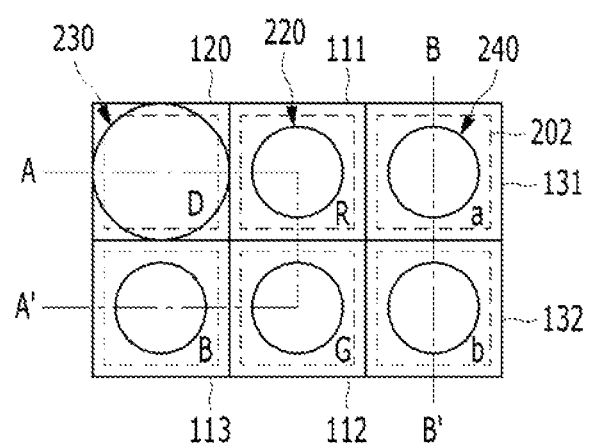
FIGS. 3A and 3B illustrate an image sensor in accordance with an embodiment.
Figure 3B:
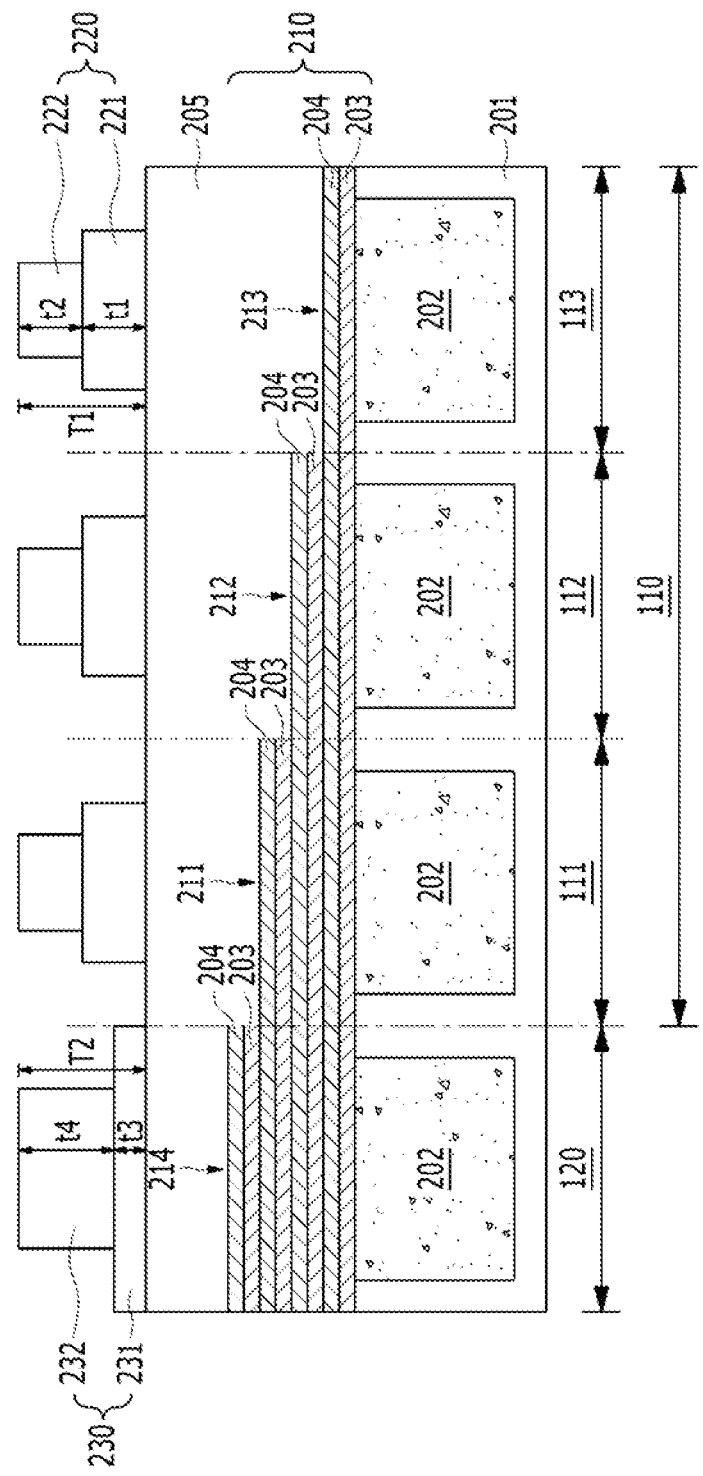
Figure 4A:
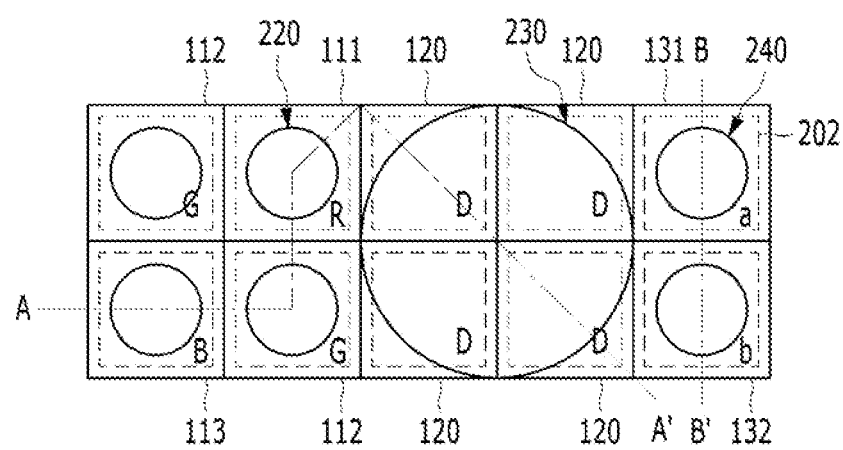
Figure 5:
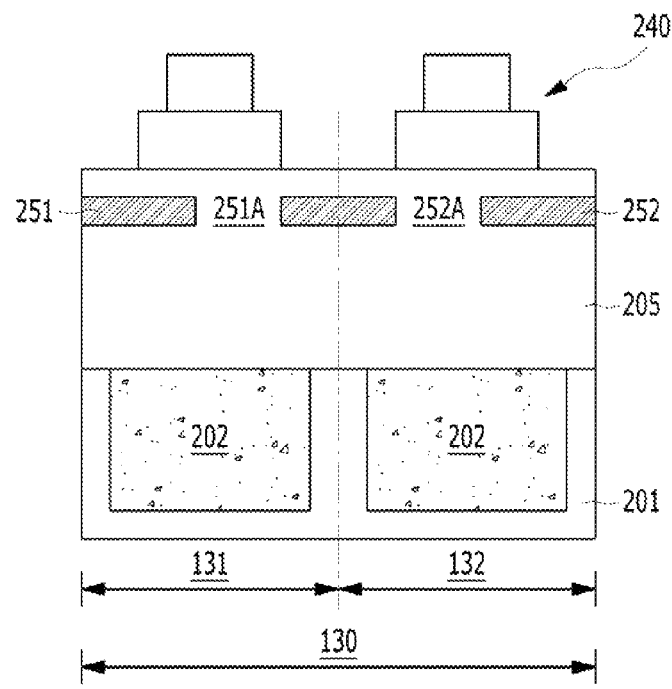
FIG. 5 is a cross-sectional view illustrating a phase difference detection pixel of the image sensor in accordance with an embodiment.

FIGS. 3A and 3B illustrate an image sensor in accordance with a first embodiment. FIG. 3A is a plan view illustrating a portion of a pixel array of the image sensor in accordance with the first embodiment, and FIG. 3B is a cross-sectional view of color detection pixels and depth detection pixels that is taken along an A-A' line shown in FIG. 3A. FIGS. 4A and 4B illustrate an image sensor in accordance with a second embodiment. FIG. 4A is a plan view illustrating a portion of a pixel array of the image sensor in accordance with the second embodiment, and FIG. 4B is a cross-sectional view of color detection pixels and depth detection pixels that is taken along an A-A' line shown in FIG. 4A. FIG. 5 is a cross-sectional view illustrating phase difference detection pixels of the image sensors in accordance with the first and second embodiments along a B-B' line shown in FIGS. 3A and 4A.

Referring to FIGS. 3A, 3B, 4A and 4B, each of the image sensors in accordance with the first and second embodiments may include a pixel array and a photoelectric conversion layer 202. In each pixel array, a plurality of pixels including a plurality of color detection pixels 110 and a plurality of depth detection pixels 120 are arranged in two dimensions.

The photoelectric conversion layers 202 corresponding to the color detection pixels 110 and the depth detection pixels 120 may have the same light receiving portions, in area and in depth. In another embodiment, the photoelectric conversion layers 202 corresponding to the color detection pixels 110 and the depth detection pixels 120 may have the same light receiving portions in terms of area, but may be different in terms of depth. For example, the depth of the photoelectric conversion layer 202 corresponding to the depth detection pixels 120 may be deeper than the depth of the photoelectric conversion layer 202 corresponding to the color detection pixels 110. In this case, quantum efficiency of the depth detection pixels 120 and a focal length to the object may be effectively enhanced.

The photoelectric conversion layer 202 may be formed in a substrate 201. The photoelectric conversion layer 202 formed in the substrate 201 may include a plurality of photoelectric converters that vertically overlap with one another. Each of the photoelectric converters may be a photodiode including an N-type impurity region and a P-type impurity region. The substrate 201 may be semiconductor substrate, and it may include a monocrystalline silicon-containing material.

The color detection pixels 110 in the image sensor in accordance with the first and second embodiments may include first color pixels 111, second color pixels 112, and third color pixels 113. The first color pixels 111 may be red pixels R, and the second color pixels 112 may be green pixels G. The third color pixels 113 may be blue pixels B.

The color detection pixels 110, which are the first color pixels 111 to the third color pixels 113, may include the photoelectric conversion layer 202, a band pass filter layer 210 disposed over the photoelectric conversion layer 202, a dielectric layer 205 disposed over the band pass filter layer 210, and a first light condensing layer 220 disposed over the dielectric layer 205. The dielectric layer 205 is formed to cover the band pass filter layer 210 over a contour of the substrate 201 including the photoelectric conversion layer 202. The dielectric layer 205 may have a planar upper surface to improve characteristics of the first light condensing layer 220.

In the color detection pixels 110, incident light with a particular wavelength band passes through the band pass filter layer 210. In short, the band pass filter layer 210 substantially performs the function of a color filter. To this end, the thicknesses of the band pass filter layer 210 corresponding to the first color pixels 111, the second color pixels 112, and the third color pixels 113 may be different from each other. To be specific, the thickness of a first band pass filter layer 211 formed over the first color pixels 111 may be thicker than the thickness of a second band pass filter layer 212 formed over the second color pixels 112. The thickness of the second band pass filter layer 212 formed over the second color pixels 112 may be thicker than the thickness of a third band pass filter layer 213 formed over the third color pixels 113. Since the band pass filter layer 210 is disposed between the photoelectric conversion layer 202 and the first light condensing layer 220, optical crosstalk between the neighboring pixels may be effectively prevented. The band pass filter layer 210 may be a stacked structure where a plurality of filter layers, having different refraction indices, is alternately stacked. The filter layers may include an oxide, a nitride, or an oxynitride. For example, the band pass filter layer 210 may be a stacked structure where a first filter layer 203 and a second filter layer 204 are alternately stacked, and the first filter layer 203 may include an aluminum nitride or a silicon oxide, and the second filter layer 204 may include a silicon nitride or a titanium oxide.

The first light condensing layer 220 may be a hemispheric lens or a stacked structure of a plurality of material layers. Upper layers of the plurality of material layers have a shorter diameter than the lower layers of the plurality of material layers. The material layers may include an oxide, a nitride, or an oxynitride. As illustrated in the drawings, when the first light condensing layer 220 is a stacked structure, the stacked structure may include a first layer 221 and a second layer 222. The second layer 222 is formed over the first layer 221 and has a shorter diameter than the first layer 221. The first layer 221 and the second layer 222 may be formed of the same material, or different materials. For example, the first layer 221 may include a silicon nitride, while the second layer 222 may include a silicon oxide. Also, the thickness t1 of the first layer 221 may be the same as the thickness t2 of the second layer 222 (t1=t2), or the thickness t1 of the first layer 221 may be different from the thickness t2 of the second layer 222 (t1≠t2). The focal length to the object may be adjusted by controlling the thickness t1 of the first layer 221 and the thickness t2 of the second layer 222 while the thickness T1 (T1=t1+t2) of the first light condensing layer 220 is fixed. For example, while the thickness T1 of the first light condensing layer 220 is fixed, the thickness t1 of the first layer 221 and the thickness t2 of the second layer 222 may be inversely proportional to each other.

Therefore, as the thickness t1 of the first layer 221 increases, the focal length may become shorter. Also, as the thickness t1 of the first layer 221 decreases, the focal length may become longer.

The depth detection pixels 120 in the image sensor in accordance with the first and second embodiments may include the photoelectric conversion layer 202, the dielectric layer 205 disposed over the photoelectric conversion layer 202, and a second light condensing layer 230 disposed over the dielectric layer 205. The second light condensing layer 230 may be formed per the depth detection pixels 120 (refer to FIGS. 3A and 3B), or two or more depth detection pixels 120 may share one second light condensing layer 230 (refer to FIGS. 4A and 4B).

The photoelectric conversion layer 202 corresponding to the depth detection pixels 120 may receive an infrared ray. Therefore, when a depth of the photoelectric conversion layer 202 corresponding to the depth detection pixels 120 is deeper than a depth of the photoelectric conversion layer 202 corresponding to the color detection pixels 110, quantum efficiency and a focal length of the depth detection pixels 120 may be effectively enhanced. This is because the infrared ray is absorbed deeper than the visible light in the photoelectric conversion layer 202 that is formed in the substrate 201 including a monocrystalline silicon-containing material.

Also, the depth detection pixels 120 may further include the band pass filter layer 210 that is formed over the depth detection pixels 120 and the color detection pixels 110. The band pass filter layer 210 is interposed between the photoelectric conversion layer 202 and the second light condensing layer 230 (refer to FIGS. 3A and 3B). To be specific, the band pass filter layer 210 formed over the depth detection pixels 120 is denoted as a fourth band pass filter layer 214. The fourth band pass filter layer 214 performs a function of cutting off the visible light so that only the infrared rays are received. In this way, intensity of the infrared rays entering the depth detection pixels 120 increases, thereby improving sensor characteristics. To this end, the thickness of the fourth band pass filter layer 214 over the depth detection pixels 120 may be thicker than the thickness of any of the first band pass filter layer 211 to the third band pass filter layer 213, which are portions of the band pass filter layer 210 formed over the color detection pixels 110.

The second light condensing layer 230 may be a stacked structure where a plurality of material layers is stacked. An upper layer of the plurality of material layers has a shorter diameter (or a smaller size) than a lower layer. The first layer 221 has a shorter diameter than the third layer 231 and the second layer 222 has a shorter diameter than the fourth layer 232.

To be specific, the second light condensing layer 230 may include a third layer 231 and a fourth layer 232 that is formed over the third layer 231 and has a shorter diameter than the third layer 231. The third layer 231 and the fourth layer 232 may be formed of the same material or different materials. For example, the third layer 231 may include a silicon nitride, while the fourth layer 232 may include a silicon oxide. When the first light condensing layer 220 is a stacked structure, where a plurality of material layers are stacked, the third layer 231 and the fourth layer 232 of the second light condensing layer 230 may be formed of the same material as those of the first layer 221 and the second layer 222 of the first light condensing layer 220, respectively.

The thickness t3 of the third layer 231 may be the same as thickness t4 of the fourth layer 232 (t3=t4), or the thickness t3 of the third layer 231 may be different from the thickness t4 of the fourth layer 232 (t3≠t4). The focal length to the object may be adjusted by manipulating the thickness t3 of the third layer 231 and the thickness t4 of the fourth layer 232 while the thickness T2 (T2=t3+t4) of the second light condensing layer 230 is fixed. For example, while the thickness T2 of the second light condensing layer 230 is fixed, the thickness t3 of the third layer 231 and the thickness t4 of the fourth layer 232 may be inversely proportional to each other.

Therefore, as the thickness t3 of the third layer 231 is increased, the focal length may become shorter. Also, as the thickness t3 of the third layer 231 is decreased, the focal length may become longer.

To provide depth detection pixels 120 which have a different focal length from the focal length of the color detection pixels 110, the second light condensing layer 230 may have a shape that is different from that of the first light condensing layer 220. To be specific, as the focal length between the depth detection pixels 120 and the object is longer than the focal length between the color detection pixels 110 and the object, depth data is generated more accurately. To this end, the second light condensing layer 230 may have a greater diameter or area than the first light condensing layer 220. In terms of the area, when a light receiving area of the photoelectric conversion layer 202 of the color detection pixels 110 is the same as a light receiving area of the photoelectric conversion layer 202 of the depth detection pixels 120, the area of the second light condensing layer 230 corresponding to the photoelectric conversion layer 202 may be greater than the area of the first light condensing layer 220 corresponding to the photoelectric conversion layer 202. Also, the second light condensing layer 230 may have the same thickness as that of the first light condensing layer 220 (T1=T2), or the second light condensing layer 230 may be thicker than the first light condensing layer 220 (T1<T2).

When the first light condensing layer 220 and the second light condensing layer 230 are all stacked structures where a plurality of material layers are stacked, the diameter or area of the lowermost layer of the first light condensing layer 220 may be shorter or smaller than the diameter or area of the lowermost layer of the second light condensing layer 230 in order to make the depth detection pixels 120 have a longer focal length than the focal length of the color detection pixels 110. To be specific, the diameter or the area of the first layer 221 of the first light condensing layer 220 may be shorter or smaller than the diameter or area of the third layer 231 of the second light condensing layer 230. Also, when the thickness T1 of the first light condensing layer 220 is the same as the thickness T2 of the second light condensing layer 230, the lowermost layer of the second light condensing layer 230 may be thinner than the lowermost layer of the first light condensing layer 220. To be specific, when the thickness T1 of the first light condensing layer 220 is the same as the thickness T2 of the second light condensing layer 230, the thickness t3 of the third layer 231 of the second light condensing layer 230 may be thinner than the thickness t1 of the first layer 221 of the first light condensing layer 220.

Also, referring to FIGS. 3A, 4A and 5, the pixels of the pixel array of the image sensor in accordance with the first or second embodiments may further include a plurality of phase difference detection pixels 130. The phase difference detection pixels 130 may include a first pixel 131 and a second pixel 132 that respectively include a light blocking layer 251 having an opening 251A and a light blocking layer 252 having an opening 252A. The openings 251A and 252A are eccentrically disposed in different directions with respect to an optical axis (or central axis) of the photoelectric conversion layer 202.

The phase difference detection pixels 130 may include the photoelectric conversion layer 202, the dielectric layer 205 disposed over the photoelectric conversion layer 202, the light blocking layers 251 and 252 formed inside the dielectric layer 205 and having the opening 251A and the opening 252A that are eccentrically disposed in different directions with respect to the optical axis of the photoelectric conversion layer 202, and a third light condensing layer 240 disposed over the dielectric layer 205. The third light condensing layer 240 may be a hemispheric lens or a stacked structure where a plurality of material layers is stacked. An upper layer of the plurality of material layers has a shorter diameter than a lower layer thereof. The third light condensing layer 240 may be the same as the second light condensing layer 230 in material.

As described above, the image sensor in accordance with the first or the second embodiment may suppress interference from external environments (e.g., high illumination environment) and generate more accurate depth data by making the color detection pixels 110 and the depth detection pixels 120 have different focal lengths. Also, since the image sensor has a simple structure, it may be easily mass-produced resulting in lower production costs.

Additionally, by employing the phase difference detection pixels 130, the image sensor may generate the depth data more accurately.

Hereafter, a method for generating depth data using the image sensor, according to an embodiment, will be explained by referring to FIGS. 6 and 7.

Figure 6:
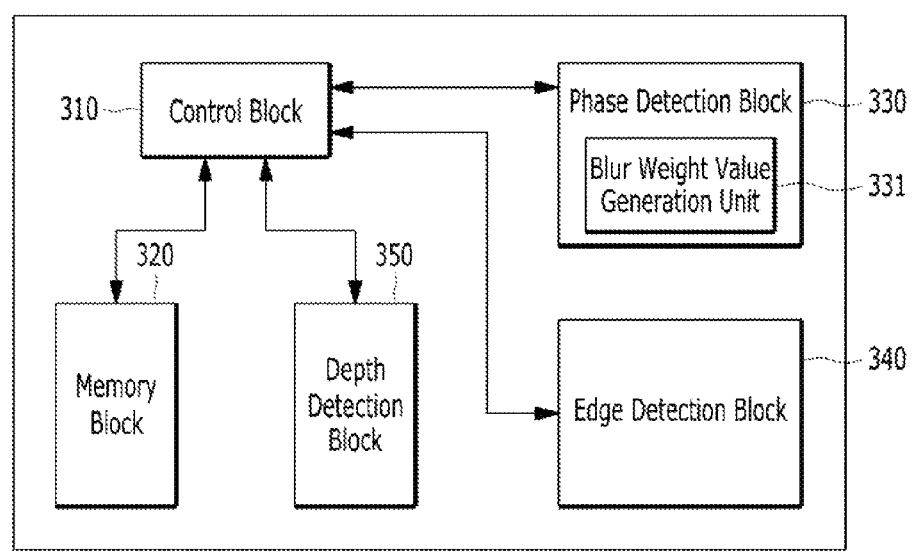
FIG. 6 is a block view illustrating an Image Signal Processor (ISP) of the image sensor in accordance an embodiment.
Figure 7:
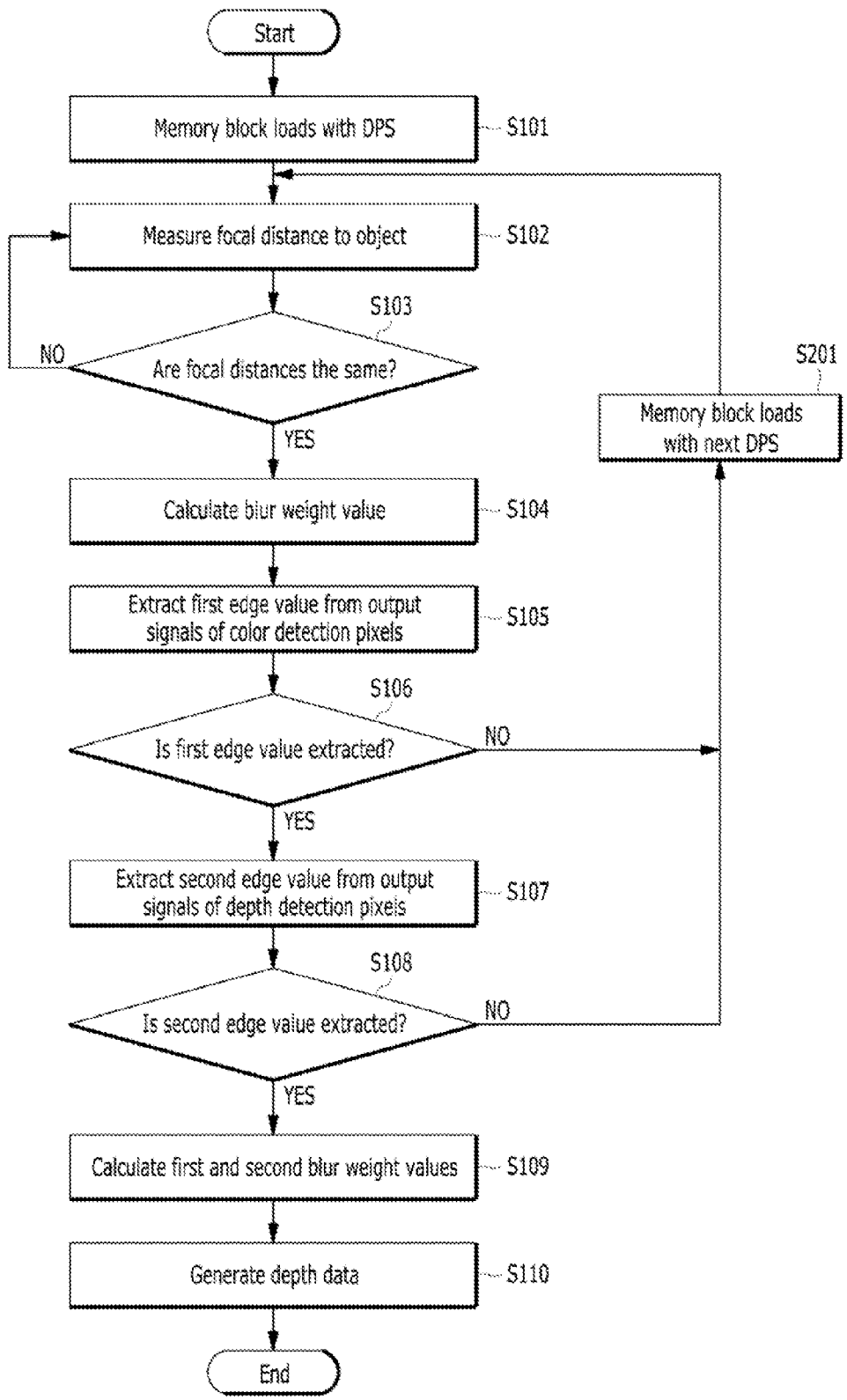
FIG. 7 is a flowchart describing a method for generating depth data in an image sensor in accordance with an embodiment.

FIG. 6 is a block diagram illustrating an Image Signal Processor (ISP) of an image sensor in accordance with an embodiment. FIG. 7 is a flowchart describing a method for generating depth data using an image sensor in accordance with an embodiment.

Referring to FIGS. 1 to 6, the image signal processor 1110 receives a digital pixel signal (DPS) outputted from the pixel array through the Correlated Double Sampler (CDS) 1130 and the Analog-Digital Converter (ADC) 1140 and processes the digital pixel signal. The image signal processor 1110 may include a control block 310, a memory block 320, a phase difference detection block 330 including a blur weight value generation unit 331, an edge detection block 340, and a depth detection block 350.

The control block 310 may perform a function of controlling operations of the image signal processor 1110. The memory block may perform a function of storing the digital pixel signal transmitted to the image signal processor 1110 and the information processed in the image signal processor 1110. The phase difference detection block 330 may perform a function of measuring the focal length and generating Depth Of Focus (DOF) information based on the output signals of the phase difference detection pixels inside the pixel array or signals provided by a phase difference detection sensor. The blur weight value generation unit 331 of the phase difference detection block 330 may generate a blur weight value based on the focal length that is needed to generate accurate depth data. The edge detection block 340 may perform a function of extracting an edge value from the digital pixel signals of the color detection pixels and the depth detection pixels. The depth detection block 350 may perform a function of generating depth data based on the data provided by the edge detection block 340 and the phase difference detection block 330 including the blur weight value generation unit 331.

Hereafter, a method for generating depth data by using an image sensor in accordance with an embodiment will be described with reference to FIGS. 6 and 7.

First, in step S101, the memory block 320 loads with Digital Pixel Signals (DPS) of a predetermined group. The Digital Pixel Signals (DPS) of the predetermined group refer to a minimum amount of data necessary to generate the depth data. For example, when digital pixel signals are provided row by row, the digital pixel signals of the predetermined group may be data included in a single row or may be a sum of data included in several to tens of rows.

The digital pixel signals of the predetermined group may include output signals of the color detection pixels, output signals of the depth detection pixels, and output signals of the phase difference detection pixels.

Subsequently, in step S102, the focal length from the digital pixel signals of the predetermined group loaded on the memory block 320 to the object is measured. The focal length to the object may be calculated in the phase difference detection block 330 based on the output signals of the phase difference detection pixels, and it may also be calculated from a deviation amount based on a phase difference.

Subsequently, in step S103, it is decided whether the measured focal length coincides with the focal length set by a user. The measurement of the focal length performed in the step S102 is repeatedly performed until the measured focal length coincides with the focal length set by the user.

Subsequently, in step S104, the blur weight value is calculated. The blur weight value may be calculated by generating Depth Of Focus (DOF) information in the phase difference detection block 330 and sampling a phase difference in the blur weight value generation unit 331 using the generated DOF information as a reference value. The phase difference refers to a difference between a phase at a front-focusing (or in-focus) pin where a focus is made in front of the object and a phase at a back-focusing (or out-focus) pin where a focus is made behind the object.

Subsequently, in step S105, a first edge value is extracted using the output signals of the color detection pixels. The output signals of the color detection pixels may be the signals of the first color pixels to the third color pixels, and the first edge value may be an edge value of color data generated in the color detection pixels. For example, the first edge value may be an edge value of RGB data generated in the red pixels, the green pixels, and the blue pixels.

Subsequently, in step S106, whether the first edge value is extracted or not is decided. The first edge value is an essential' parameter for generating the depth data. Therefore, if the first edge value is not extracted, the memory block 320 loads with digital pixel' signals of the next group in step S201 and the above-described processes are repeated.

Subsequently, in step S107, a second edge value is extracted by using the output signals of the color detection pixels. To extract the second edge value, some of the output signals of the color detection pixels and the output signals of the depth detection pixels may be used. To be specific, the second edge value may be extracted by using the depth detection pixel signals generated from infrared rays and the color detection pixel signals generated from the red pixels (which may be the first color pixels) of a wavelength band adjacent to the infrared rays.

Subsequently, in step S108, whether the second edge value is extracted or not is decided. The second edge value is an essential parameter for generating the depth data along with the first edge value. Therefore, if the second edge value is not extracted, the memory block 320 loads with digital pixel signals of the next group in step S201 and the above-described processes are repeated.

Subsequently, in step S109, a first blur value and a second blur value are generated. The first blur value and the second blur value may be generated by calculating size values of blurs of the first edge value and the second edge value that are extracted based on a Point Spread Function (PSF), and reflecting the blur weight value calculated in advance into the calculated size values of the blurs, respectively. The size values of the blurs calculated based on the first and second edge values and the point spread function may be amplified by reflecting the blur weight value.

Subsequently, in step S110, depth information is generated based on a difference between the first blur value and the second blur value.

According to an embodiment, an image sensor includes color detection pixels and depth detection pixels with different focal lengths that are integrated in a pixel array to suppress interference from the external environment, such as a high illumination environment, and generate accurate depth data. Also, with a simple structure, the image sensor may be easily mass-produced with a lower production cost.

In addition, the phase difference detection pixels may further improve accuracy of the depth data of the image sensor.

What is claimed is:

1. An image sensor, comprising:
   a plurality of pixels that include a plurality of color detection pixels and a plurality of depth detection pixels, wherein the plurality of pixels are arranged in two dimensions; and
   a photoelectric conversion layer formed to correspond to the plurality of the pixels,
   wherein each of the plurality of the color detection pixels comprises: a first light condensing layer disposed over the photoelectric conversion layer; and a band pass filter layer interposed between the photoelectric conversion layer and the first light condensing layer, and
   wherein each of the plurality of the depth detection pixels comprises: a second light condensing layer disposed over the photoelectric conversion layer and having a greater size than a size of the first light condensing layer.

2. The image sensor of claim 1, further comprising:
   a dielectric layer formed over the photoelectric conversion layer, having a planar upper surface, and including the band pass filter layer,
   wherein the first light condensing layer and the second light condensing layer are formed over the dielectric layer.

3. The image sensor of claim 1,
   wherein the band pass filter layer extends to the plurality of depth detection pixels to be interposed between the photoelectric conversion layer and the second light condensing layer.

4. The image sensor of claim 3,
   wherein the band pass filter layer of the depth detection pixels is thicker than the band pass filter layer of the color detection pixels.

5. The image sensor of claim 1,
   wherein two or more of the depth detection pixels share one second light condensing layer.

6. The image sensor of claim 1,
   wherein a thickness of the first light condensing layer is the same as a thickness of the second light condensing layer, or the first light condensing layer is thinner than the second light condensing layer.

7. The image sensor of claim 1,
   wherein each of the first light condensing layer and the second light condensing layer includes a stacked structure of a plurality of material layers,
   wherein an upper layer of the first light condensing layer has a smaller size than a lower layer of the first light condensing layer, and
   wherein an upper layer of the second light condensing layer has a smaller size than a lower layer of the second light condensing layer.

8. The image sensor of claim 7,
   wherein a size of a lowermost layer of the first light condensing layer is shorter than a size of a lowermost layer of the second light condensing layer.

9. The image sensor of claim 7,
   wherein a total thickness of the first light condensing layer is the same as a total thickness of the second light condensing layer, and
   wherein a lowermost layer of the second light condensing layer is thinner than a lowermost layer of the first light condensing layer.

10. The image sensor of claim 1,
    wherein the first light condensing layer includes a hemispheric lens,
    wherein the second light condensing layer includes a stacked structure of a plurality of material layers, and
    wherein an upper layer of the plurality of material layers has a smaller size than a lower layer of the plurality of material layers.

11. The image sensor of claim 1,
    wherein the band pass filter layer includes a stacked structure of a plurality of filter layers, and
    wherein the plurality of filter layers have different refraction indices from each other.

12. The image sensor of claim 1,
    wherein the plurality of color detection pixels includes first color pixels, second color pixels, and third color pixels,
    wherein the band pass filter layer of the first color pixels is thicker than the band pass filter layer of the second color pixels, and
    wherein the band pass filter layer of the second color pixels is thicker than the band pass filter layer of the third color pixels.

13. The image sensor of claim 12,
wherein the first color pixels include red pixels, and the second color pixels include green pixels, and the third color pixels include blue pixels.

14. The image sensor of claim 1,
wherein the plurality of pixels further comprise a plurality of phase difference detection pixels, and
wherein each of the plurality of the phase difference detection pixels comprises:
- a third light condensing layer disposed over the photoelectric conversion layer; and
- a light blocking layer interposed between the photoelectric conversion layer and the third light condensing layer and having an opening that is eccentrically disposed with respect to an optical axis of the photoelectric conversion layer.

15. The image sensor of claim 14,
wherein the third light condensing layer includes a hemispheric lens or a stacked structure of a plurality of material layers, and
wherein an upper layer of the plurality of material layers has a smaller size than a lower layer of the plurality of material layers.

16. A method for generating depth data in an image sensor provided with a plurality of pixels including a plurality of color detection pixels, a plurality of depth detection pixels, and a plurality of phase difference detection pixels that are arranged in two dimensions, comprising:
- calculating a blur weight value from the plurality of phase difference detection pixels;
- extracting a first edge value from the plurality of color detection pixels;
- extracting a second edge value from the plurality of depth detection pixels;
- calculating a first blur value and a second blur value based on the first edge value and the second edge value using a Point Spread Function;
- amplifying the first blur value and the second blur value by reflecting the blur weight value into the first blur value and the second blur value; and
- generating depth information based on a difference between the amplified first blur value and the amplified second blur value.

* * * * *